United States Patent [19]
Oda et al.

[11] Patent Number: 4,874,598
[45] Date of Patent: Oct. 17, 1989

[54] PROCESS FOR PRODUCING PEROVSKITE-TYPE OXIDES OF THE ABO$_3$ TYPE

[75] Inventors: Kyoko Oda; Kunimasa Takahasi, both of Mie; Iwao Seo, Ibaraki, all of Japan

[73] Assignee: Mitsubishi Petrochemical Co., Ltd., Tokyo, Japan

[21] Appl. No.: 144,172

[22] Filed: Jan. 15, 1988

[30] Foreign Application Priority Data

Jan. 20, 1987 [JP] Japan ................................. 62-9080
Feb. 27, 1987 [JP] Japan ................................. 62-44970
Feb. 27, 1987 [JP] Japan ................................. 62-44971

[51] Int. Cl.$^4$ ....................... C01G 23/00; C01G 25/00
[52] U.S. Cl. ................................... 423/598; 252/62.9; 423/593; 501/134; 501/135
[58] Field of Search ............... 423/593, 598; 252/62.9; 501/134, 135

[56] References Cited

U.S. PATENT DOCUMENTS

| | | | |
|---|---|---|---|
| 4,019,915 | 4/1977 | Miyauchi et al. | 501/135 |
| 4,547,355 | 10/1985 | Uedaira et al. | 423/593 |
| 4,696,810 | 9/1987 | Shirasaki et al. | 423/593 |

FOREIGN PATENT DOCUMENTS

| | | | |
|---|---|---|---|
| 59-039722 | 3/1984 | Japan | 423/593 |
| 59-131505 | 7/1984 | Japan | 423/553 |
| 61-174116 | 8/1986 | Japan | 423/593 |
| 61-251517 | 11/1986 | Japan | 423/553 |
| 61-251518 | 11/1986 | Japan | 423/593 |
| 62-072523 | 4/1987 | Japan | 423/593 |
| 62-072524 | 4/1987 | Japan | 423/593 |

OTHER PUBLICATIONS

Patent Abstracts of Japan, vol. 11, No. 268 (C-444) [2715], Aug. 29, 1987, "Production of ABO3 Perovskite Type Oxide".
Patent Abstract of Japan, vol. 11, No. 101 (C-413) [2548], Mar. 31, 1987., "Production of Perovskite Type Oxide".
Patent Abstracts of Japan, vol. 8, No. 126 (C-228) [1563], Jun. 13, 1984, "Manufacture of Perovskite Type Oxide Powder".

*Primary Examiner*—Jack Cooper
*Attorney, Agent, or Firm*—Oblon, Spivak, McClelland, Maier & Neustadt

[57] ABSTRACT

A process for producing a perovskite-type oxide of the ABO$_3$ type is disclosed. A solution of an element A (Pb, Ca, Sr and/or La) and an element B (Ti and/or Zr) is brought into contact with oxalic acid in the presence of an alcohol to precipitate oxalic acid salts; the acid radicals in the solution are neutralized with an amine or ammonia; the resulting precipitate is then subjected to calcination.

A fine-grained ferroelectric oxide having a sharp grain size distribution can be produced, with its chemcial composition being exactly controlled. This oxide is suitable for use as a piezoelectric, pyroelectric or ferroelectric material.

10 Claims, 8 Drawing Sheets

PROCESS FOR PRODUCING PEROVSKITE-TYPE OXIDES OF THE ABO₃ TYPE

FIELD OF THE INVENTION

The present invention relates to a process for producing a perovskite-type oxide that is useful as a piezoelectric, pyroelectric or ferroelectric material either in itself or in the form of a composite with a rubber, plastics, or other polymeric materials.

BACKGROUND OF THE INVENTION

Perovskite-type oxides of the $ABO_3$ type (where the element A is Pb, Ca, Sr or La; and the element B is Ti or Zr) are conventionally produced by the following methods:

(1) mixing the powders of the oxides of constituent elements and heating the mixture to high temperatures to cause a solid-phase reaction;

(2) adding oxalic acid dropwise to an aqueous solution containing the ions of constituent elements, coprecipitating the constituent elements in the form of their oxalic acid salts, and subjecting the coprecipitated oxalic acid salts to thermolysis (see, for example, U.S. Pat. No. 3,352,632);

(3) hydrolyzing the mixture of alkoxides of constituent elements to form a precipitate and subjecting the coprecipitated hydrolyzate to thermolysis (see, for example, Japanese Laid-Open Patent Application No. 86022/85); and (4) a multi-stage wet process in which lead hydroxide or zirconium hydroxide is preliminarily synthesized using aqueous ammonia and a solution of titanium tetrachlorides is added thereto, followed by precipitation with aqueous ammonia (see, for example, Japanese Laid-Open Patent Application No. 106456/86).

However, these methods have one or more problems and are far from being satisfactory for commercial purposes. The major problem of the first method concerns a manufacturing process in that the solid-phase reaction involved requires high temperatures and prolonged periods. In addition, the powder produced by this method is defective in that it is difficult to sinter unless elevated temperatures or a sintering accelerator is employed. In the second method, the oxalic acid salts of the ingredients have different solubilities in water which is used as a coprecipitation medium and hence it is difficult to exactly control the proportion in which the respective ingredients are to be coprecipitated in such a way that a single-phase composition will be produced. The third method has the advantage that a homogeneous product of high purity is produced but its production is not easy to achieve since the respective ingredients are used in the form of alkoxides. The fourth method which relies upon a multi-stage wet process can be performed using inexpensive materials but the calcined product must be crushed before sintering.

Two methods have been proposed to improve the second process involving the use of oxalic acid. They take advantage of the fact that oxalic acid is soluble in ethanol whereas the oxalic acid salts of elements A and B are both insoluble in ethanol. According to the first approach, the ion of element A and Ti ion are reacted with oxalic acid in ethanol so that the two ions are coprecipitated as oxalic acid salts (Japanese Laid-Open Patent Application No. 39722/84). In the second approach, the ion of element A and Zr ion or (Zr+Ti) ion are coprecipitated as oxalic acid salts (Japanese Laid-Open Patent Application No. 131505/84). As a result, a precipitate of a desired composition that has high purity and a uniform grain size (i.e., a precursor of the desired perovskite-type oxide) is formed. This precipitate is subjected to thermolysis so as to produce a fine powder of $ATiO_3$, $AZrO_3$ or $A(Zr,Ti)O_3$ that is active and is easily sinterable. In these improved methods, the ion of element A is used as a solution of a nitric acid salt of element A in water or ethanol-containing water.

It is generally held that Ti and Zr ions are preferably used as a solution of titanium oxynitrate or zirconium oxynitrate in water or ethanol-containing water. It has been pointed out that if chlorides are used as sources of the supply of these ions, chloride ions tend to remain in the coprecipitate; even if this coprecipitate is calcined at elevated temperatures, the residual chloride compounds still remain in the calcined product (namely, the desired oxide) and cause adverse effects mainly on its sinterability. It has also been pointed out that if $Pb^{2+}$ is used as the ion of an element A, undesirable insoluble lead chloride will be formed in an aqueous solution of mixed ions.

In the two improved versions of the second method, Ti ions (from titanium oxynitrate) or Zr ions (from zirconium oxynitrate) and the ions of an element A are reacted with oxalic acid in the presence of ethanol and the resulting coprecipitate of oxalic acid salts is filtered, dried and crushed into particles, which are calcined at a temperature between 700° and 1,000° C. where calcination of the coprecipitate is completed and no change in weight will occur. Although these procedures enable the production of a desired perovskite-type oxide, the proposed methods require that the calcined product be crushed again into particles, which are mixed together before they are molded and sintered at 1000° to 1400° C.

The reason for the need to crush the calcined product into particles and to mix them together is that the fine grains of perovskite-type oxide have fused together to form agglomerates during calcination. The step of recrushing and remixing not only increases the manufacturing cost but also reduces the reliability of the final product by letting impurities get into the calcined product. This step causes another problem associated with the characteristics of the powder perovskite-type oxide.

An active research is underway to produce highly flexible piezoelectric and dielectric films from composites of the perovskite-type oxide powder with other materials such as poly(vinylidene fluoride) resins, polyoxymethylene resins, or nitrile-butadiene rubbers. In order to produce satisfactory products, the fine powder of perovskite-type oxide must satisfy the requirements that they have a uniform grain size distribution, be free from crystal distortion and be easy to disperse into organic compounds. However, it is known that the fine powder obtained by the step of recrushing and remixing has crystal distortions induced in it and is unable to display any of the anticipated performances.

Another point that should be noted here is that although fine ceramic grains must be uniformly dispersed in a substrate with a thickness of not more than 10 μm, preferably 1 to 5 μm, to make a dielectric film, the crushed particles have such a broad grain size distribution that the desired film reliability cannot be ensured.

The present inventors previously conducted extensive studies in order to unravel the mechanism by which the fine particles of calcined product would fuse together to form agglomerates. As a results, the present inventors found that chloride ions remaining in small amounts in an aqueous solution of the mixed ions from starting materials were responsible for the agglomeration of fine particles during calcination and that this phenomenon could be retarded by reducing the concentration of chloride ions below a certain level. Based on these findings, the present inventors and Yamamura filed a patent application which was later published as Japanese Laid-Open Patent Application No. 174116/86.

Following the filing of this Laid-Open patent application, the present inventors proposed the following in Japanese Laid-Open Patent Application No. 211516/86: if the precipitate of a precursor is synthesized under such conditions that the concentration of the ions of element A in the aqueous solution is in the range of 0.2 to 1 mol/l, with ethanol being used in 0.5 to 4 volumes per volume of the aqueous solution, a powder having the same characteristics as those of the product shown in Japanese Laid-Open Patent Application No. 174116/86 is synthesized and with the cost of its production being significantly reduced in account of the dramatic decrease in the amount of the ethanol used.

The present inventors made another proposal in Japanese Laid-Open Patent Application No. 211519/86 by showing that ethanol may be replaced by isopropanol or normal propanol to obtain a perovskite-type oxide powder having comparable performance. This proposal offered the potential to realize a further reduction in the manufacturing cost of a perovskite-type oxide powder.

The present inventors also proposed in Japanese Patent Laid-Open Application No. 251517/86 that the ions of element B that partly dissolve in the aqueous solution containing ethanol or isopropanol be precipitated again by blowing dry ammonia into that solution which has been thoroughly agitated to disperse the precipitate after completion of the reaction of precipitate formation. According to this method, the loss of the ion of element B can be reduced while the proportions of the ions of elements A and B in the precipitate are precisely controlled.

In their continued research, the present inventors conducted a series of experiments in which an aqueous solution containing lead nitrate and titanium oxynitrate was subjected to the reaction for the formation of the precipitate of oxalic acid: salts (i.e., precursor of the perovskite-type oxide) using alcohols having 4 to 15 carbon atoms. It was found that the Ti/Pb atomic ratio set for the feed materials was essentially reproduced in $PbTiO_3$ that was obtained by calcining the precipitate. This result was quite surprising in that it could not have been attained with ethanol or propanol. A proposal based on this finding was disclosed in Japanese Laid-Open Patent Application No. 251518/86.

The present inventors continued their research on how to control the proportions of constituent elements in oxides of the $ABO_3$ type in oxalic salts coprecipitation method.

One of the observations found as a result of these efforts was that a desired oxide of the $ABO_3$ type could be produced quantitatively and consistently over time by controlling the constituent elements in such proportions that the oxalic acid (precipitating agent) to Ti in $TiO(NO_3)_2$ was adjusted to $\frac{1}{2}$ (mol/mol), rather than the conventionally established value of 1/1 (mol/mol). On the basis of this finding, the present inventors disclosed in Japanese Laid-Open Patent Application No. 72523/87 that by employing this novel ratio, the fine grains of an oxide of the $ABO_3$ type could be consistently synthesized from a combination of Pb (element A) and at least one of Ti and Zr (element B) in an oxalic acid/ethanol system. The present inventors also disclosed that similar results could be attained by employing an oxalic acid/water system (Japanese Laid-Open Patent Application No. 72524/87).

In the specifications of the above-mentioned prior inventions, the present inventors showed that the fine particles of an oxide of the $ABO_3$ type could be consistently produced by applying an unconventional stoichiometric ratio to the precipitate of oxalic acid salts formed from titanium oxynitrate and zirconium oxynitrate. However, as will be understood from the fact that only Pb is mentioned as element A, Ca, Sr, Ba, La, etc. are unsuitable for use as element A since their oxalates will partly dissolve into the mother liquor under the conditions employed in these two prior inventions and are incapable of yielding an intended oxide of the $ABO_3$ type in a quantitative manner.

In the prior art techniques, alcohols were used in order to prevent the ions of elements A and B from dissolving in an aqueous solution. This method was effective in completely inhibiting the dissolution of Pb, Zr and Ti oxalates in a range rendered acidic with nitric acid. However, as illustrated by the following reaction schemes, conversion of nitrates to oxalates involves the formation of nitric acid in a large amount:

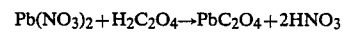

$Pb(NO_3)_2 + H_2C_2O_4 \rightarrow PbC_2O_4 + 2HNO_3$

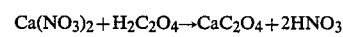

$Ca(NO_3)_2 + H_2C_2O_4 \rightarrow CaC_2O_4 + 2HNO_3$

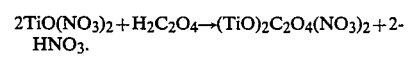

$2TiO(NO_3)_2 + H_2C_2O_4 \rightarrow (TiO)_2C_2O_4(NO_3)_2 + 2HNO_3$.

Oxalates other than $PbC_2O_4$ such as $CaC_2O_4$, $SrC_2O_4$, $BaC_2O_4$ and $La_2(C_2O_4)_3$ that were used to form the precipitate of a precursor containing element A were exposed to a strongly acidic atmosphere created by the presence of a large amount of nitric acid in mother liquor. Since the dissolution inhibiting action of ethanol and other alcohols was not fully exhibited under the strongly acidic condition, Ca ions could not be completely prevented from dissolving into the mother liquor. The results were the same with other non-Pb ions (i.e., Sr, Ba and La) and it was impossible to control exactly the ratio of existence of element A to element B in the finally obtained oxide of the $ABO_3$ type.

However, Ca, Sr and Ba are elements that are indispensable to the synthesis of ceramics such as $CaTiO_3$, $SrTiO_3$, $BaTiO_3$, $(PbCa)TiO_3$, $(PbSr)TiO_3$ and $(PbBa)TiO_3$, and La is important as an element to be used in the synthesis of light-transmitting piezoelectric ceramics generally referred to as PLZT.

The present inventors continued their studies in order to develop a process by which not only perovskite-type oxides of the $ABO_3$ type containing Pb as element A but also those having Pb substituent at site A with varying proportions of other metal ions such as Ca, Sr, Ba and La can be synthesized by a chemical synthesis reaction using the novel stoichiometric ratio disclosed in Japanese Laid-Open Patent Application Nos. 72523/87 and 72524/87. Special emphasis was placed on the efforts to seek a method for producing a fine-grained oxide of the $ABO_3$ type by means of quantitatively precipitating not only Pb but also Ca, Sr or La as element A.

SUMMARY OF THE INVENTION

An object, therefore, of the present invention is to provide a process for synthesizing a perovskite-type oxide of the $ABO_3$ type by precipitation from an aqueous solution, in which the proportions of constituent elements in various combinations thereof can be strictly controlled by quantitative precipitation of not only Pb but also Ca, Sr or La that have been considered unsuitable for use as element A in the prior art.

A more specific object of the present invention is to provide a process for producing a perovskite-type oxide of the $ABO_3$ type (where A is at least one element selected from the group consisting of Pb, Ca, Sr and La; and B is at least one element selected from the group consisting of Ti and Zr) which comprises allowing an acidic aqueous solution containing the ions of the necessary constituent elements to have contact with oxalic acid in the presence of at least one alcohol selected from the group consisting of ethanol, propanol, butanol, pentanol and hexanol, thereby forming the precipitate of oxalic acid salts that serves as a precursor of said oxide, and subsequently performing calcination of said precursor precipitate, wherein oxalic acid is added in an amount that is equal to the sum of 0.98 to 1.02 moles per mol of at least one element selected from the group consisting of Pb, Ca, Sr and La as element A present in said acidic aqueous solution and 0.49 to 0.51 mole per mole of at least one element selected from the group consisting of Ti and Zr as element B also present in said acidic aqueous solution and any acid radical present in the solution containing said precursor precipitate is neutralized with ammonia or an amine.

The following advantages are offered by the process of the present invention.

(1) The ratio of element A to element B in the perovskite-type oxide produced can be made in substantial agreement with that in the mixture of feed materials.

(2) As a results of (1), the proportions of plural elements of both group of element A and group of element B can be strictly controlled within a tolerance of 1 mol %.

(3) Since nitric acid can be preliminarily added to an acidic aqueous solution, it is easy to control the size of particles in the oxide to be produced.

(4) There is no possibility that the precipitate formed will redissolve in the mother liquor, so the reproducibility of the reaction can be satisfactorily ensured even if factors such as the mixing rate of oxalic acid to elements A and B, reaction time of neutralization and filtering period are adjusted to lie within optimum ranges for commercial operations.

(5) The use of titanium oxynitrate prepared from an expensive metal alkoxide or the use of expensive zirconium oxynitrate is effective in the production of easily dispersible and highly crystalline perovskite-type oxides and, according to the present invention, unwanted loss of these materials due to dissolution can be sufficiently inhibited to prevent undue and substantial increase in the production cost of the perovskite-type oxides.

DETAILED DESCRIPTION OF THE INVENTION

Perovskite-type oxide

Figure 1:
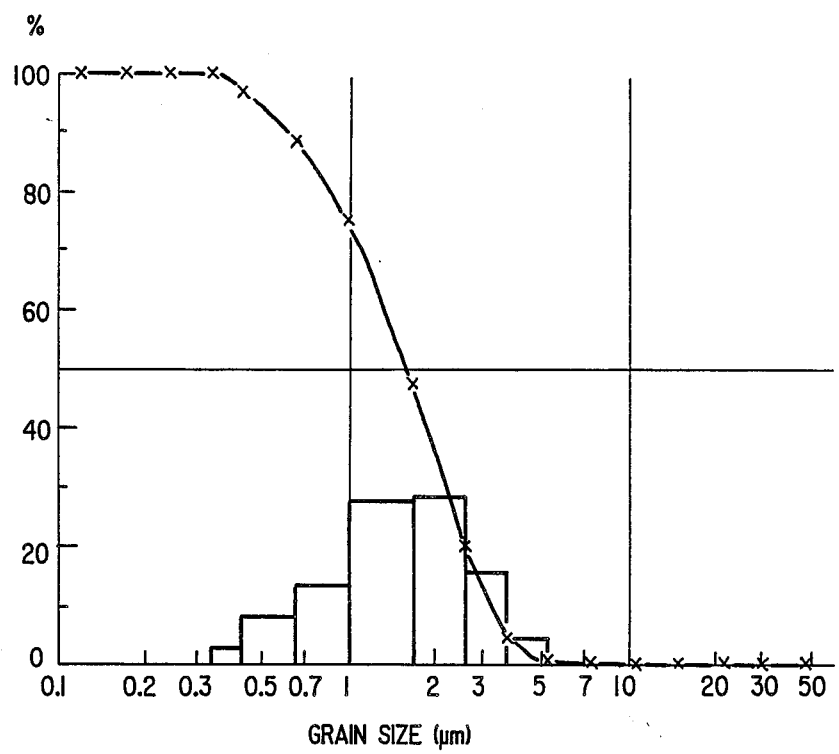
FIG. 1 is a graph showing the grain size distribution of the powder of $(Pb_{0.70}Ca_{0.30})TiO_3$ produced by calcining at 1,000° C.

The perovskite-type oxide to be produced by the process of the present invention is of the $ABO_3$ type in which A is at least one element selected from the group consisting of Pb, Sr, Ca and La, and B is at least one element selected from the group consisting of Ti and Zr.

Examples of the perovskite-type oxide that can be synthesized by the process of the present invention include $PbTiO_3$, $PbZrO_3$, $Pb(Zr\cdot Ti)O_3$, $CaTiO_3$, $CaZrO_3$, $(Pb\cdot Ca)TiO_3$, $(Pb\cdot Ca)ZrO_3$, $(Pb\cdot Ca)(Zr\cdot Ti)O_3$, $SrTiO_3$, $SrZrO_3$, $(Pb_{1-x}La_x)(Ti\cdot Zr)O_3$.

Preparation of the precipitate of a precursor of perovskite-type oxide

Element A

Element A necessary for preparing a precursor for perovskite-type oxide is used in the form of a water-soluble compound of Pb, Ca, Sr and/or La. Soluble compounds of these elements are generally used and acetic acid salts and nitric acid salts are preferably used. Nitric acid salts are particularly preferred.

Particularly preferred water-soluble compounds of element A are metal nitrates having such a chlorine content that the maximum ratio of chlorine to element A is up to 0.02, with a value of substantially zero being more preferable.

Element B

Element B which is another essential component for preparing the precursor of perovskite-type oxide is used in the form of a water-soluble compound of Ti and/or Zr. Soluble salts such as oxynitrates are generally used. For example, titanium oxynitrate can be synthesized as a substantially chlorine-free compound by reacting concentrated nitric acid with titanium hydroxide prepared by hydrolyzing an alkoxide such as titanium tetraisopropoxides. If titanium tetrachlorides are used as a starting material, a titanium hydroxide precipitate formed with aqueous ammonia is subjected to repeated thorough washing so as to remove residual chloride ions until the atomic ratio of Cl to Ti in the aqueous solution of titanium oxynitrate is reduced to up to 0.02, preferably up to 0.01.

If zirconium oxynitrate is used as a soluble salt of Zr, it suffices that this compound has a purity comparable to that of commercially available reagents.

Coprecipitation

In order to prepare the precursor of perovskite-type oxide, an acidic solution containing compounds, preferably nitric acid salts, of at least one element A selected from among Pb, Sr, Ca and La and at least one element B selected from among Ti and Zr is brought into contact with oxalic acid in the presence of an alcohol.

The proportions of elements A and B to be added are strictly controlled in such a way that they will conform to their proportions in the perovskite-type oxide to be produced.

Elements A and B are added in the form of a solution, generally in the form of aqueous solution. Solution of elements A and B is rendered acidic, generally by means of nitric acid.

The acidity of the aqueous solution containing metal nitrates can be varied by changing the amount of nitric acid added. By adjusting the ratio of nitric acid to element B (mol/mol) to be within the range of 0 to 5, preferably in the range of 0.01 to 4, the perovskite-type oxide to be obtained as the final product can be controlled to have the smaller particle size and the narrower size distribution.

The ions of elements in the acidic aqueous solution can be adjusted to have the highest possible concentrations to such an extent that the ions of elements selected from groups A and B can be completely dissolved under given conditions. As a guide, the ions of element A may have a concentration in the range of 0.05 to 1 mole/l, preferable in the range of 0.1 to 0.5 mole/l.

The alcohol which is to be present when the acidic aqueous solution of elements A and B is contacted with oxalic acid is at least one alcohol selected from the group consisting of ethanol, propanol, butanol, pentanol and hexyl alcohol, and preferably at least one alcohol selected from the group consisting of ethanol and propanol.

There is no particular limit on the method to be used for adding alcohols. In one method, a homogeneous aqueous solution of elements A and B is first formed and then an alcohol is added, followed by the addition of solid oxalic acid.

Alternatively, oxalic acid and an alcohol may be added simultaneously by adding a solution of oxalic acid in alcohol (an alcoholic solution of oxalic acid) to a homogeneous aqueous solution of elements A and B. In the other method, the homogeneous aqueous solution of elements A and B may be poured into the solution of oxalic acid in alcohol.

The amount of alcohol added is adjusted to be such that 1 to 10 volumes, preferably 2 to 4 volumes, of alcohol are present in the solution containing the precursor precipitate with respect to one volume of water also present in this solution.

One mole of oxalic acid must be added per mole of the ions of element A in the aqueous solution in order to achieve quantitative precipitation of a precursor in the form of an oxalate of element A. Half a mole of oxalic acid must be added per mole of the ions of element B ($Ti^{4+}$, $Zr^{4+}$) The amount of oxalic acid to be added may have a tolerance of $\pm 2\%$, preferably $\pm 1\%$, of the theoretically required value with respect to the ions of element A. Similarly, a tolerance of $\pm 2\%$, preferably $\pm 1\%$, of the theoretically required value may be allowed with respect to the ions of element B.

One feature that characterizes the process of the present invention is that oxalic acid and element B are not used at the stoichiometric ratio of 1/1 (mole/mole) as heretofore been considered reasonable, but at an oxalic acid to element B ratio of $\frac{1}{2}$ (mole/mole). Therefore, the presence of any excess oxalic acid is essentially undesirable since it will participate in a reaction for redissolving the precipitate of an oxalic acid salt of element B and cancel the principal feature of the present invention. In other words, the smaller the deviation of the oxalic acid to element B ratio from the above-specified $\frac{1}{2}$ (mole/mole), the better the results that can be attained.

Oxalic acid is added in an amount that is equal to the sum of 0.98 to 1.02 moles per mole of element A present in an acidic aqueous solution of elements A and B and 0.49 to 0.51 mole per mole of element B also present in the acidic aqueous solution, preferably in an amount that is equal to the sum of 0.99 to 1.01 moles per mole of element A present in the acidic aqueous solution and 0.495 to 0.505 mole per mole of element B also present in the acidic aqueous solution.

The constituent elements for preparing an oxide of the $ABO_3$ type that are present in the aqueous acidic solution may be precipitated as oxalates by adding the acidic aqueous solution of elements A and B dropwise to a vigorously agitated alcoholic solution containing oxalic acid. Alternatively, such an alcoholic solution may be added dropwise to the acidic aqueous solution of elements A and B under vigorous agitation. The rate of the formation of oxalates may be selected from a certain range that will not cause a rapid increase in the temperature of the reaction system.

The reaction temperature can be selected from a broad range, preferably from the range of near 0° C. up to 50° C., more preferably from the range of near 0° C. up to 30° C. Temperatures low enough to cause freezing of the acidic aqueous solution should be avoided. In view of the thermallability of titanium oxynitrate in the acidic aqueous solution, increasing the temperature of the acidic aqueous solution above 50° C. after titanium oxynitrate has been incorporated should be avoided as much as possible since an unwanted precipitate can form during the reaction for the synthesis of precipitate on account of the selfdecomposition of titanium oxynitrate.

After the precipitate of precursor has been formed by contacting the acidic aqueous solution of elements A and B with oxalic acid in the presence of alcohol, any acid radicals in the precipitate containing solution are neutralized with ammonia or an amine. Illustrative ammonia and amines that can be used to neutralize the acid radicals present in the solution containing the precursor precipitate include (slurry-containing solution): ammonia; hydrazine; alkylamines such as methylamine, dimethylamine, trimethylamine, ethylamine, diethylamine and triethylamine; alkylenediamines such as ethylenediamine and 1,3-propanediamine; alkanolamines such as ethanolamine, 1-amino-2-oxypropane, and 2-amino-1-hydroxypropane; hydroxylamine; and mixtures thereof. Preferably, ammonia is used in the form of a gas and/or concentrated aqueous ammonia.

Ammonia must be added in an amount commensurate with the acid (preferably nitric acid) that has formed as a by-product in the reaction for the formation of oxalates and with the nitric acid preliminarily added to the acidic aqueous solution of elements A and B.

Ammonia may be added in the form of a dry gaseous and/or concentrated aqueous ammonia. If two or more volumes of the alcoholic solution containing oxalic acid are to be used per volume of the acidic aqueous solution of elements A and B, the use of concentrated aqueous ammonia is more preferred since water additionally supplied from the concentrated aqueous ammonia will not accelerate the dissolution of the precursor precipitates. The rate of addition of ammonia can be selected as appropriate and may be increased within a range that will not cause a rapid increase in the temperature of the reaction system on account of the heat of formation of ammonium nitrate.

The pH of the slurry-containing solution that has been subjected to neutralization with ammonia or an amine can be measured with pH test paper that provides for a limited range of measurements. Depending upon the combination of constituent elements, the final pH to be attained as a result of neutralization may be adjusted to lie within the range of 6 to 8, preferably from 6.2 to 7.5, and this is effective for the purpose of closely controlling the proportions of the constituent elements that are required of the oxide of the $ABO_3$ type to be produced by the present invention.

After the addition of oxalic acid and ammonia or an amine, a completion of the reactions may be performed by continuing the agitation for a sufficient time to complete the reaction.

After completion of the neutralization, the precipitate is recovered as a white cake by filtration. The recovered white cake is desirably washed with the alcohol specified above so as to remove the ammonium nitrate that has been formed as a result of the reaction, thereby replacing the greater part of the residual mother liquor in the precipitate with the alcohol. The slurry-containing washings are filtered to recover a white cake.

The recovered white cake is dried and crushed into particles to obtain a powder of the precursor of perovskite-type oxide. Crushing performed at this stage is important for ensuring that an adequate amount of oxygen will flow in a subsequent step of calcination. The dried cake can be readily reduced to fine particles by a weak milling force and the particles need not be rendered in a completely dispersed state at this stage, so there is no likelihood that the crushing means will become a source of impurities.

Production of the fine powder of perovskite-type oxide

The precursor powder prepared by the procedures described above is then calcined at a suitable temperature, say, between 500° C. and 1,200° C., preferably between 600° C. and 1,100° C. The calcination is desirably performed at low temperatures and must be carried out at such a temperature that no more change in weight will occur.

After the calcination temperature is reached, the precursor powder is maintained at that temperature for a period of from 10 minutes to 50 hours, preferably from 30 minutes to 30 hours.

As a result of calcination, the precursor undergoes thermolysis to produce a ferroelectric oxide of the perovskite type.

The precursor powder may be heated at a rate of 0.01° to 50° C./min. In consideration of such factors as the amount and the thickness of precursor powder to be charged, a value of 0.1° to 5° C./min may be selected as a heating rate that will not cause rapid thermolysis of the precursor powder.

Pure oxygen or air may be selected as a calcination atmosphere. A reducing atmosphere is not suitable since it will cause undesired side-reactions such as formation of lead metal.

The so prepared perovskite-type oxide may be shaped and sintered for immediate use as a ferroelectric material. The shaped product may be polarized in a high electric field for use as a piezoelectric material.

The perovskite-type oxide powder of the present invention may be blended with a polymeric material such as a rubber or a synthetic resin to make a dielectric or piezoelectric composite material. A rubbery polymer and/or a resinous polymer may be used as the polymer component of the dielectric or piezoelectric composite material. Either at least one rubbery polymer or at least one resinous polymer or a mixture of both may be used as the polymer component.

Useful rubbery polymers include natural rubber, SBR (styrene-butadiene rubber), ethylene-propylene rubber, silicone rubber, acrylonitrile-butadiene rubber, epichlorohydrin rubber, fluororubber and urethane rubber. Among these compounds, the acrylonitrile-butadiene rubber, epichlorohydrin rubber, fluororubber and urethane rubber are preferred.

These rubbery polymers may be independently blended with the fine oxide particles to make dielectric composite materials. Alternatively, they may be vulcanized by addition of an appropriate curing agent or some other suitable curing method, so as to make dielectric composite materials. If desired, the rubbery polymers may be used in combination with suitable amounts of resinous polymers.

The resinous polymers that can be used are in no way limited to any particular types but those which have high crystallinity and dielectric constant, such as polyacetal resins, poly(vinylidene fluoride) resins, polyacrylonitrile resins and polyamide resins, are preferably used. Other usable examples include polypropylene resins, polyethylene resins, chlorinated polyethylene resins and polyester resins. These resinous polymers may be blended, either singularly or in combination, with the fine particles of the ferroelectric oxide so as to make dielectric composite materials.

In preparing dielectric composite materials, the fine particles of the ferroelectric oxide may be incorporated in amounts of 1 to 200, preferably 2 to 150, parts by weight per 10 parts by weight of the rubbery polymer and/or resinous polymer.

Any standard mixing device may be employed, such as a kneader, a mixing roll mill, an extruder, a Plastograph, a variety of mixers, and a ball mill. Shaping may be performed by any known method such as extrusion molding or calendering. The blend may be shaped into any desired form such as a plate, a cylinder or a sheet.

A dielectric composite material can also be fabricated by filming a dispersion of the fine particles of ferroelectric oxide in a solution having a resinous polymer dissolved in a suitable solvent. If desired, a solvent-soluble rubbery polymer may be incorporated in the dispersion.

The dielectric composite material thus produced may be furnished with electrically conductive electrodes that are formed in close contact with both surfaces of the shaped product either by applying metal foils, conductive resins or pastes or by depositing metal coatings by vacuum deposition or chemical plating.

For use in the production of a dielectric composite material, the perovskite-type oxide of the present invention preferably has a composition represented by $(Pb_{1-x},Ca_x)TiO_3$ ($0.35 \leq x < 0.95$).

The following advantages are offered by fabricating a dielectric composite material according to the method of the present invention.

(1) The composition of the ferroelectric oxide produced by the present invention can be accurately controlled, so a composition that best matches the use of a specific dielectric composite material and the properties required of it (e.g. $\epsilon$, tan$\delta$, film thickness and flexibility) can be arbitrarily selected.

(2) In accordance with the process of the present invention, the proportions of constituent elements such as Pb, Ca and Ti are closely controlled for stoichiometric values at the stage where oxalates are precipitated and by subsequently calcining the composition in the air at 500° to 1,200° C., preferably at 600° to 1,100° C., an oxide that retains the so controlled stoichiometric values can be produced. Since this process prevents the formation of excess Pb, oxide particles having a narrow size distribution can be attained without experiencing any abnormal grain growth during calcination. Substantially all particles in the oxide powder are fine enough to have a size not greater than 1 $\mu$m. This process enables the fabrication of a very thin dielectric composite material not thicker than 10 $\mu$m.

A piezoelectric composite material can also be produced in accordance with the present invention by the following procedures: the necessary ingredients are mixed by the methods described above and the blend is shaped into a desired form; the shaped product is heated at a predetermined temperature with a d.c. electric field (or an a.c. electric field superposed on a d.c. electric field) being applied to both sides of the shaped product for a predetermined period of time; thereafter, the shaped product is cooled to room temperature and the applied electric field is removed to leave thermoelectret states behind.

To create a thermoelectret, the shaped product is heated at a temperature not higher than the level at which the polymer(s) will start to flow, generally between 0° C. and 200° C., preferably between 20° C. and 180° C. For application of an electric field, a metal foil, a conductive resin or a conductive paste that is attached closely to both sides of the shaped product, or a metal coating formed either by vacuum deposition or chemical plating may be used as electrodes. The strength of the electric field to be applied generally ranges from 10 kV/cm to a value that will not cause dielectric breakdown, preferably in the range of 20 to 300 kV/cm. The poling time is in no way limited but a period of at least 10 minutes is preferred.

The oxide to be used to fabricate a piezoelectric composite material preferably has a composition that is represented by the formula $(Pb_{1-x}Ca_x)TiO_3$ $(0 < x < 0.35)$.

The following advantages are offered by fabricating a piezoelectric composite material according to the method of the present invention.

(1) The composition of the ferroelectric oxide produced by the present invention can be controlled at such a high accuracy that a composition that provides for best matching between the capabilities required of a specific piezoelectric composite material (Kt value, $\epsilon$ value, dielectric loss and film flexibility) can be easily selected.

(2) In accordance with the process of the present invention, the proportions of constituent elements A and B are closely controlled for stoichiometric values at the stage where oxalates are precipitated and by subsequently calcining the composition in the air at 500° to 1,200° C., preferably 600° to 1,100° C., an oxide that retains the so controlled stoichiometric values can be produced. If the calcination is conducted at up to 800° C., all of the particles in the oxide powder have a size not greater than 1 $\mu$m, and even if the calcination temperature is 1,000° C., the particle size can be held no greater than 5 $\mu$m. In this way, the particle size of the oxide powder produced by the present invention can be adjusted to a value that matches the use and functions of a specific piezoelectric composite material. For instance, a powder produced by calcining at 1,000° C. can satisfactorily be used to fabricate a piezoelectric composite film having a thickness of not greater than 20 $\mu$m.

(3) A piezoelectric composite material containing thermoelectret states produced from a mixture of the fine particles of $(Pb_{1-x}Ca_x)TiO_3$ with a rubbery polymer and/or a resinous polymer by the process of the present invention is capable of satisfying both the requirements for high Kt and $\epsilon$ values, which is quite unexpected from the piezoelectric composite materials employing oxide particles produced by the prior art mixed oxide process. For example, a piezoelectric composite material formed of $(Pb_{0.75}Ca_{0.25})TiO_3$, acrylonitrile-butadiene rubber and polyacetal exhibits remarkable characteristics as manifested by Kt>30% and $\epsilon$>60. As a further advantage, thermoelectret states can be created under very mild conditions and with the applied voltage being drastically reduced. Because of these advantages, not only a thin dielectric composite film but also a much thicker film on the order of $10^2$ $\mu$m can be readily fabricated although it has been difficult to create electret states in the latter thick film if it is made of the conventional lead titanate composite system. Coupled with their high-sensitivity characteristics, these films find useful applications such as interior-probing ultrasonic sensors.

The following examples are provided for the purpose of further illustrating the present invention but are in no way to be taken as limiting.

EXAMPLE 1

Synthesis of the fine particles of $(Pb_{0.70}CA_{0.30})TiO_3$

Commercially available titanium tetraisopropoxides (500 ml) was added dropwise to distilled water (7,000 ml) to form a hydroxide, which was filtered and washed three times with pure water (1,000 ml) so as to obtain titanium hydroxide. The titanium hydroxide was added to 200 ml of ice-cooled, commercially available concentrated nitric acid of guaranteed quality. The mixture was left to stand for one whole day and night and filtered to obtain a solution of titanium oxynitrate. The concentration of Ti ions measured in terms of $TiO_2$ by gravimetric analysis was found to be 0.1173 g Ti/ml. The solution of titanium oxynitrate (140 ml) was mixed with 79.9190 g of lead nitrate of guaranteed quality (purity, 99.5%), 24.6686 g of calcium nitrate tetrahydrate of guaranteed quality (purity, 99.5%), 76.79 ml of nitric acid of guaranteed quality and 1498 ml of ion-exchanged water to form an aqueous solution with Pb/Ca/Ti=0.70/0.30/1.00 (molar ratio) and $HNO_3$/Ti=3/1 (molar ratio). This solution was held at room temperature.

Oxalic acid dihydrate of guaranteed quality (65.1856 g: purity, 99.5%) was dissolved in 5145 ml of ethanol of guaranteed quality and the resulting solution was held at room temperature. This solution was such that when mixed with the previously prepared acidic aqueous solution, the molar ratio of $(COOH)_2$ to $(Pb+Ca+Ti)$ would be 0.75 and the volume ratio of ethanol to the acidic aqueous solution being 3/1.

The acidic aqueous solution was added to the vigorously agitated ethanolic solution of oxalic acid at a rate of about 224 ml/min to form a white slurry solution. After the addition was completed, the slurry solution was agitated for an additional 5 minutes. Thereafter, aqueous ammonia of guaranteed quality (216.18 ml) was poured into the agitated slurry solution over a period of about 1 minute, followed by continued stirring for 5 more minutes. The pH of the slurry solution as measured with BTB test paper was 7.2.

A mother liquor in the slurry solution was separated from a white precipitated cake by means of a pressurized filter machine.

The separated white cake was charged into 3470 ml of ethanol and subjected to crushing and washing operations for 30 minutes. Subsequently, the washings were separated from a white cake by means of a pressurized filter machine. The white cake obtained by performing another cycle of these operations was dried for one hour in a pressurized filter machine under a nitrogen stream. The resulting semi-dry cake was spread thinly over a stainless steel plate the surface of which was held at 150° C. so as to evaporate ethanol. The cake was further dried in an oven with internal air circulation at 110° C. for 6 hours so as to obtain a precursor powder.

The precursor powder was lightly crushed in an agate mortar and thereafter calcined in a muffle furnace at 1,000° C. for 2 hours to obtain the desired oxide powder at a yield of 96.9%.

Physical properties of the oxide powder

Figure 2:
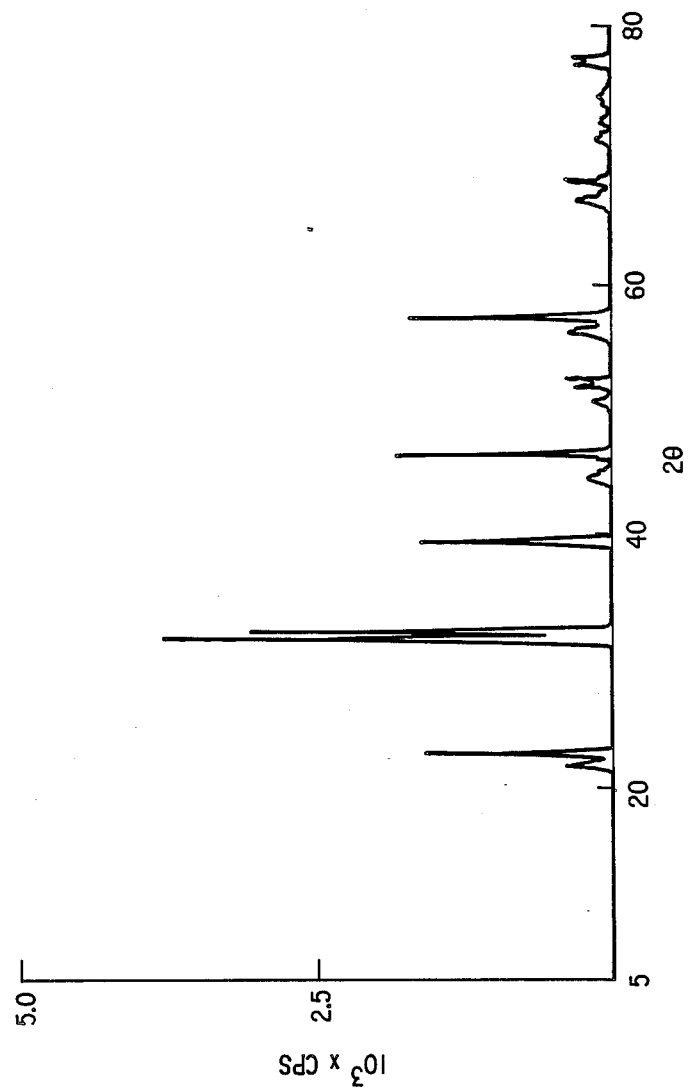
FIG. 2 is an X-ray diffraction scan for the powder of $(Pb_{0.70}Ca_{0.30})TiO_3$ produced by calcining at 1,000° C.

The compositional formula of the oxide powder as determined by X-ray fluoroscopy was $(Pb_{0.70}Ca_{0.30})Ti_{0.99}O_3$. This powder had a BET surface area of 1.85 $m^2/g$. The mean primary grain size as determined from this BET value was 0.26 $\mu m$. The grain size distribution of the powder as measured with a Microtrac granulometer is shown in FIG. 1. An X-ray diffraction scan of the powder is shown in FIG. 2. Crystal lattice analysis showed a c/a axis ratio of 1.037.

EXAMPLE 2

Synthesis of the fine particles of $(Pb_{0.7}Sr_{0.3})TiO_3$

Twenty-five milliliters of an aqueous solution of titanium oxynitrate (0.1222 g Ti/ml) that was prepared as in Example 1 was mixed with 4.0919 g of strontium nitrate (purity, 99%), 14.8674 g of lead nitrate (purity, 99.5%), 14.29 ml of concentrated nitric acid of guaranteed quality and 279.7 ml of ion-exchanged water to make an aqueous solution with Pb/Sr/Ti=0.70/0.30/1.00 (molar ratio) and $HNO_3$/Ti=3/1 (molar ratio). The solution was thereafter held at room temperature (20° C.).

Oxalic acid dihydrate of guaranteed quality (12.1265 g; purity, 99.5%) was dissolved in 957 ml of ethanol of guaranteed quality and the resulting solution was held at room temperature. This solution was such that when mixed with the previously prepared aqueous solution, the molar ratio of $(COOH)_2/(Pb+Sr+Ti)$ would be 0.75 and the volume ratio of ethanol to the acidic aqueous solution being 3/1.

The ethanolic solution of oxalic acid was added to the vigorously agitated acidic aqueous solution (pH<0.4) over a period of 1 minute and 26 seconds. Then, 40.2 ml of concentrated aqueous ammonia of guaranteed quality was added dropwise over a period of about 1 minute. After completion of the neutralizing reaction, the slurry solution had a temperature of 30.3° C. and a pH of 7.4.

A mother liquor in the slurry solution was separated from a white precipitate by means of a pressurized filter machine. The separated white precipitate was charged into 682 ml of ethanol and subjected to crushing and washing operations for 30 minutes. Subsequently, the washings were separated from a white precipitate by means of a pressurized filter machine. The white precipitate obtained by performing another cycle of these operations was dried for an hour in a pressurized filter machine under $N_2$ stream to obtain a semi-dry white cake. The cake was dried, crushed and calcined (800° C.×2 hours) as in Example 1 to obtain an oxide powder at a yield of 96.63%.

Physical properties of the oxide powder

As with $(Pb_{0.70}Sr_{0.30})TiO_3$, the X-diffraction pattern of the obtained oxide powder had a peak shift for $PbTiO_3$ but did not have any peak for PbO and other impurities. Crystal lattice analysis showed a c/a axis ratio of 1.038.

Figure 3:
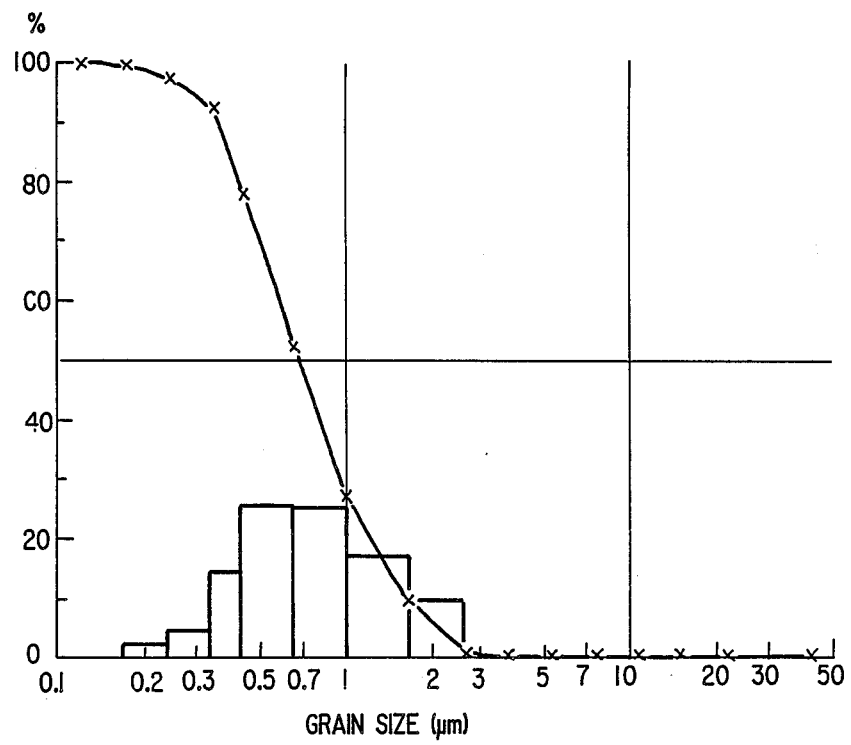
FIG. 3 is a graph showing the grain size distribution of the powder of $(Pb_{0.70}Sr_{0.30})TiO_3$ produced by calcining at 800° C.

The results of particle size distribution measurement with a Microtrac granulometer are shown in FIG. 3.

EXAMPLE 3

Synthesis of the fine particles $Pb(Zr_{0.96}Ti_{0.24})O_3$

Two milliliters of an aqueous solution of titanium oxynitrate (0.1202 g Ti/ml) that was prepared as in Example 1 was mixed with 41.7831 g of lead nitrate of guaranteed quality (purity, 99.5%), 33.2012 g of zirconium oxynitrate dihydrate (purity, 97.0%) and 625.6 ml of ion-exchanged water to make an acidic aqueous solution with Pb/Zr/Ti=1.00/0.96/0.04 (molar ratio) and pH=0.8. The solution was thereafter held at room temperature (20° C.).

Oxalic acid dihydrate of guaranteed quality (23.8561 g; purity, 99.5%) was dissolved in 1883 ml of ethanol of guaranteed quality and the resulting solution was held at room temperature. This solution was such that when mixed with the previously prepared aqueous solution, the molar ratio of $(COOH)_2/(Pb+Zr+Ti)$ would be 0.75 and the volume ratio of ethanol to the acidic aqueous solution being 3/1.

The ethanolic solution of oxalic acid was added to the vigorously agitated acidic aqueous solution over a period of 3 minutes. Then, 39.6 ml of concentrated aqueous ammonia was added over a period of 1 minute. After completion of the neutralizing reaction, the slurry solution had a temperature of 27.6° C. and a pH of 6.8.

A mother liquor in the slurry solution was separated from a white precipitate by means of a pressurized filter machine. The separated white precipitate was charged into 1731 ml of ethanol and subjected to crushing and washing operations for 30 minutes. Subsequently, the washings were separated from a white precipitate by means of a pressurized filter machine. The white precipitate obtained by performing another cycle of these crushing and washing operations was subsequently treated as in Example 1; it was dried with $N_2$ gas, freed of the solvent on a stainless steel plate, dried in an oven, crushed in an agate mortar and calcined in a muffle furnace at 700° C. for 2 hours. As a result, an oxide powder was obtained at a yield of 96.2%.

Physical properties of the oxide powder

Figure 4:
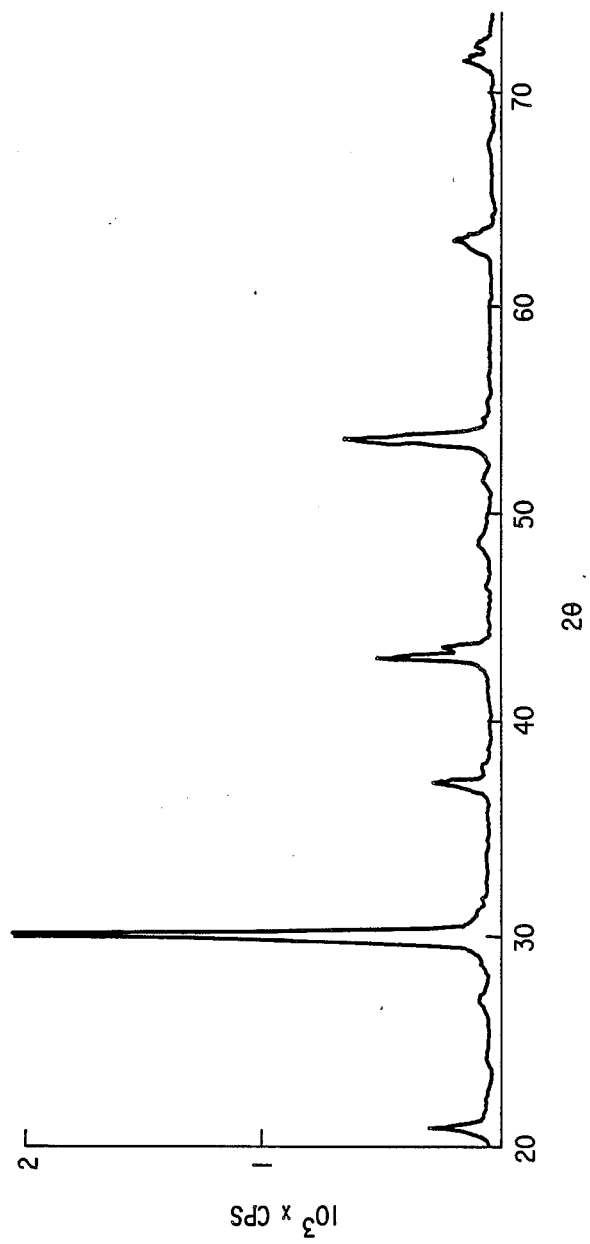
FIG. 4 is an X-ray diffraction scan for the powder of $Pb(Zr_{0.96}Ti_{0.04})O_3$ produced by calcining at 700° C.
Figure 5:
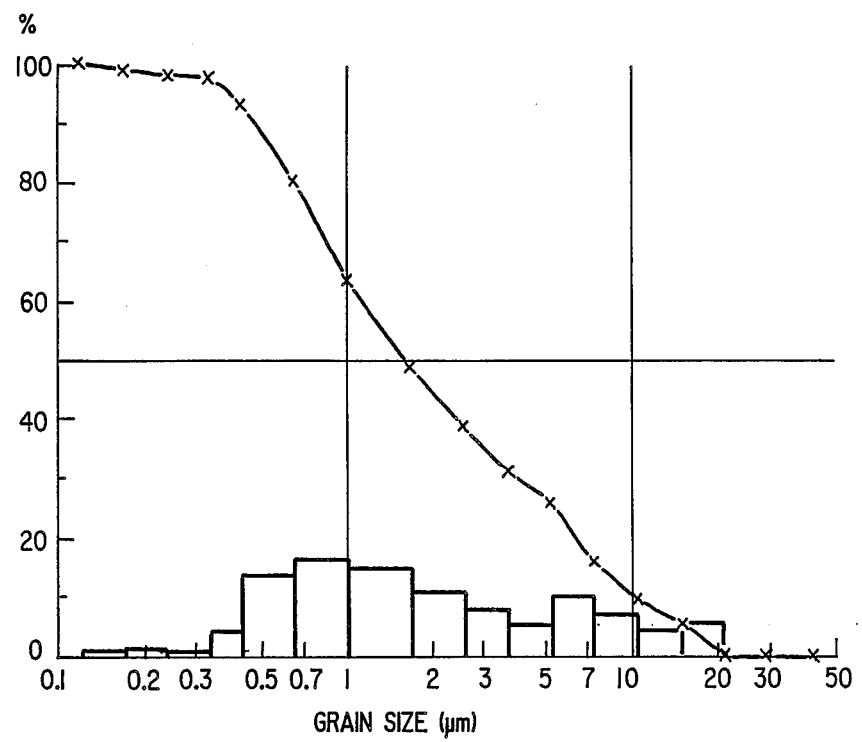
FIG. 5 is an X-ray diffraction scan for the powder of $Pb(Zr_{0.96}Ti_{0.04})O_3$ produced by calcining at 700° C.

The compositional ratio of elements in the oxide powder as measured by X-ray fluoroscopy was Pb/Zr/Ti=1/0.041/0.956 (molar ratio). An X-ray diffraction scan of the powder is shown in FIG. 4. The results of grain size distribution measurement with a Microtrac granulometer are shown in FIG. 5.

EXAMPLE 4

(1) Synthesis of the fine particles of $(Pb_{0.60}Ca_{0.40})TiO_3$

Commercially available titanium tetraisopropoxides (500 ml) was dropwise added to distilled water (7,000 ml) to form a hydroxide, which was filtered and washed three times with pure water (1,000 ml) so as to obtain titanium hydroxide. The titanium hydroxide was added to 200 ml of ice-cooled, commercially available concentrated nitric acid of guaranteed quality. The mixture was left to stand for one whole day and night and filtered to obtain a solution of titanium oxynitrate. The concentration of Ti ions measured in terms of $TiO_2$ by gravimetric analysis was found to be 0.1173 g Ti/ml. The solution of titanium oxynitrate (40 ml) was mixed with 68.5020 g of lead nitrate of guaranteed quality (purity, 99.5%), 32.8915 g of calcium nitrate tetrahydrate of guaranteed quality (purity, 99.5%), 76.79 ml of nitric acid of guaranteed quality and 1498 ml of ion-exchanged water to form an aqueous solution with Pb/Ca/Ti=0.60/0.40/1.00 (molar ratio) and $HNO_3$/Ti=3/1 (molar ratio). This solution was held at room temperature.

Oxalic acid dihydrate of guaranteed quality (65.1856 g; purity, 99.5%) was dissolved in 5145 ml of ethanol of guaranteed quality and the resulting solution was held at room temperature. This solution was such that when mixed with the previously prepared aqueous solution, the molar ratio of $(COOH)_2/(Pb+Ca+Ti)$ would be 0.75 and the volume ratio of ethanol to the acidic aqueous solution being 3/1.

The acidic aqueous solution was added to the vigorously agitated ethanolic solution of oxalic acid at a rate of about 225 ml/min to form a white slurry solution. After the addition was completed, the slurry solution was agitated for an additional 5 minutes. Thereafter, aqueous ammonia of guaranteed quality (216.2 ml) was poured into the agitated slurry solution over a period of about 1 minute, followed by continued stirring for 5 more minutes. The pH of the slurry solution as measured with BTB test paper was 7.2.

A mother liquor in the slurry solution was separated from a white precipitated cake by means of a pressurized filter machine.

The separated white cake was charged into 3241 ml of ethanol and subjected to crushing and washing operations for 30 minutes. Subsequently, the washings were separated from a white cake by means of a pressurized filter machine. The white cake obtained by performing another cycle of these operations was dried for one hour in a pressurized filter machine under a nitrogen stream. The resulting semi-dry cake was spread thinly over a stainless steel plate the surface of which was held at 50° C. so as to evaporate ethanol. The cake was further dried in an oven with internal air circulation at 100° C. for 6 hours so as to obtain a precursor powder.

The precursor powder was slightly crushed in an agate motar and thereafter calcined in a muffle furnace at 1,000° C. for 8 hours to obtain the desired oxide powder at a yield of 98.3%.

Physical properties of the oxide powder

The compositional formula of the oxide powder as measured by X-ray fluoroscopy was $(Pb_{0.6}Ca_{0.39})Ti_{0.98}O_3$. This powder had a BET surface area of 1.95 m²/g. The mean primary particle size as determined from this BET value was 0.53 82 m.

(2) Fabrication of dielectric composite material

Four gram of a polyacetal resin (Delrin 500 of E.I. du Pont Numerous) was worked on a mixing mill with two rolls heated at 185° C. After the resin formed a uniform melt, 1.5 g of acrylonitrile-butadiene rubber (ZF-11 of Nippon Zeon Co., Ltd.) was added in small portions. The resin and the rubber were uniformly mixed for 10 minutes with 20.06 g of the $(Pb_{0.60}Ca_{0.40})TiO_3$ previously prepared in (1) as it was added in small portions.

A sheet having a diameter of 8 cm and a thickness of 121 μm was molded from the composite with a press heated at 185° C. Disks having a diameter of 2 cm were punched from this sheet and an electrode having a diameter of 1 cm and a conductor path with a width of 1 mm were formed on both sides of each disk by gold deposition.

(3) Electrical characteristics of the dielectric composite material

Figure 6:
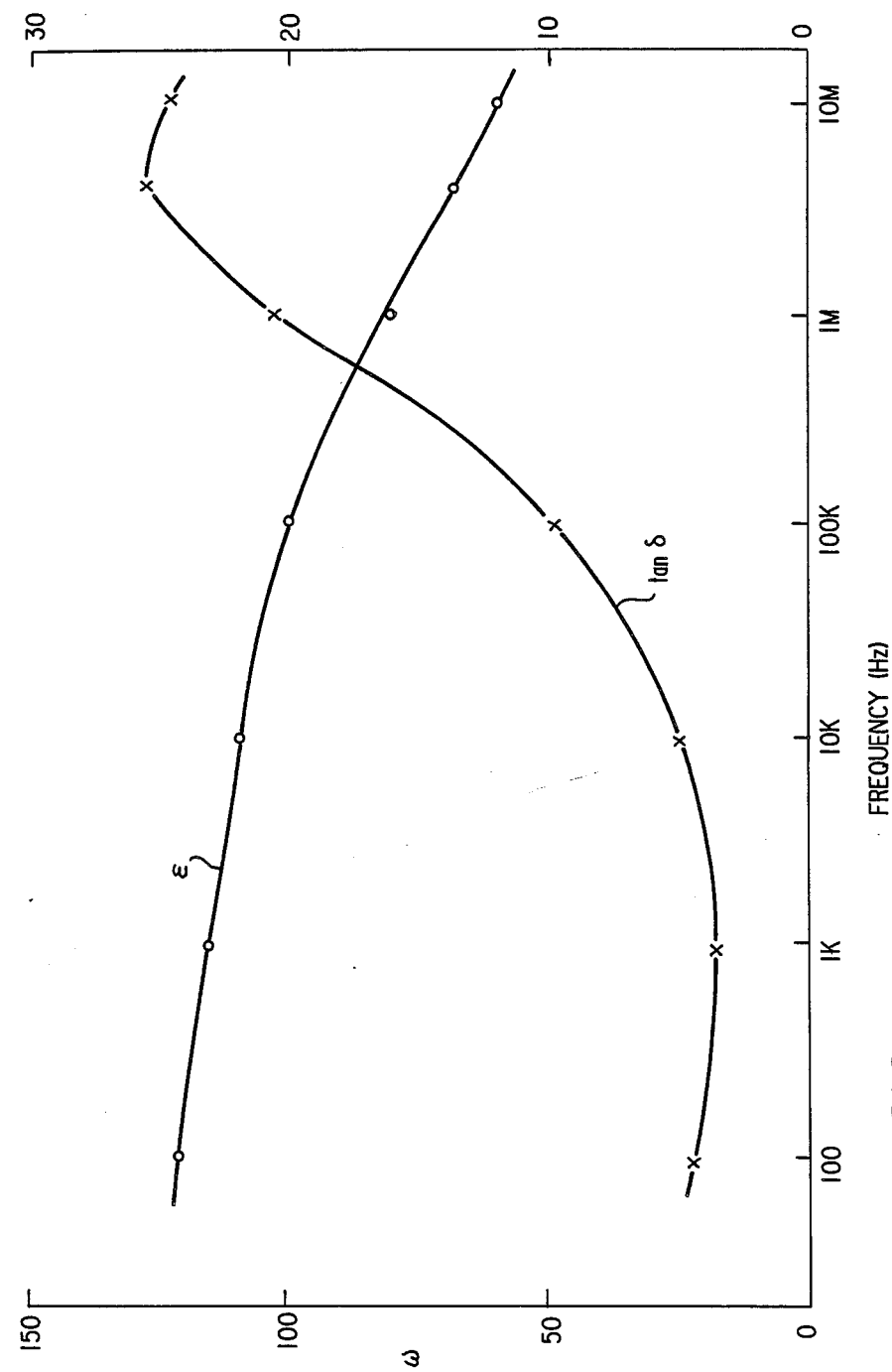
FIG. 6 is a graph showing frequency characteristic curves for $\epsilon$ and $\tan\delta$ of the ferroelectric oxide composite prepared in Example 4.
Figure 7:
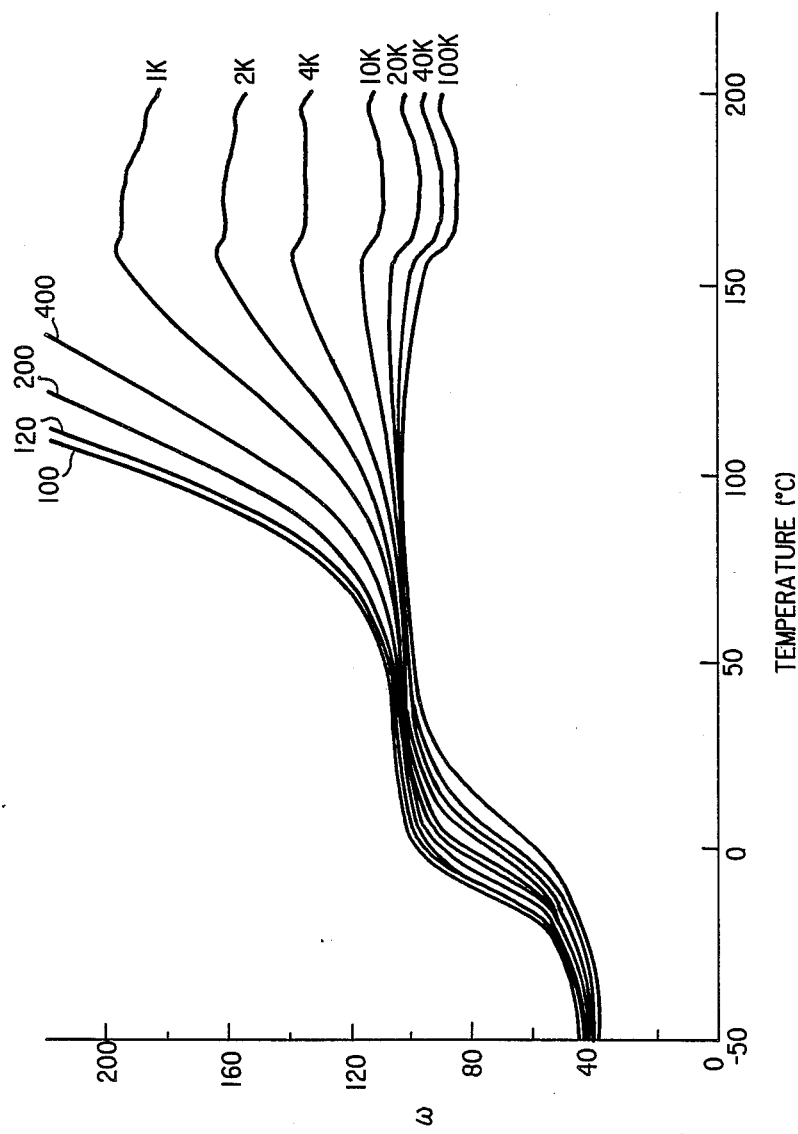
FIG. 7 is a graph showing the temperature dependency of $\epsilon$ of the ferroelectric oxide composite prepared in Example 4.
Figure 8:
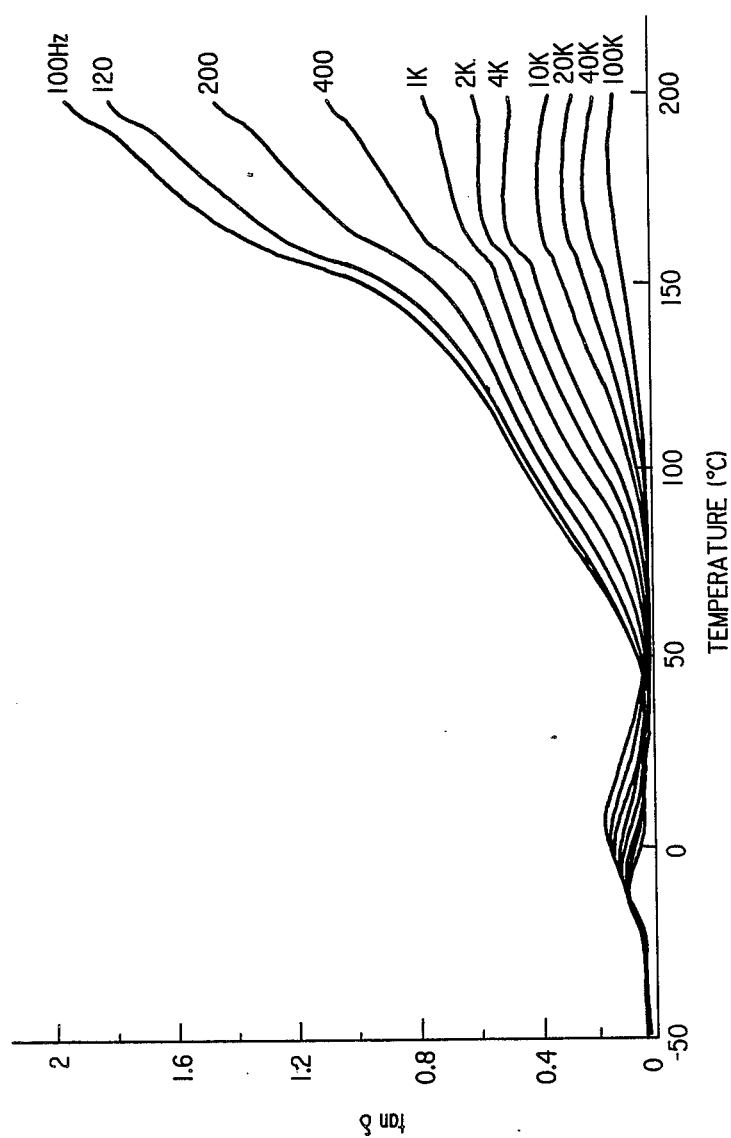
FIG. 8 is a graph showing the temperature dependency of $\tan\delta$ of the ferroelectric oxide composite prepared in Example 4.

The frequency dependencies of the dielectric constants and losses of the samples of dielectric composite material prepared in (2) were measured at room temperature with LCR meters (YHP-4274A and YHP 4275A). The results are shown in FIG. 6. The temperature dependencies of the two parameters were also measured with an impedance analyzer (YHP-4274A) and the results are shown in FIG. 7 (ε vs. temperature) and FIG. 8 (tan δ vs. temperature).

EXAMPLE 5

(1) Synthesis of the fine particles of $(Pb_{0.75}Ca_{0.25})TiO_3$

Commercially available titanium tetraisopropoxides (500 ml) was dropwise added to distilled water (7,000 ml) to form a hydroxide, which was filtered and washed three times with pure water (1,000 ml) so as to obtain titanium hydroxide. The titanium hydroxide was added to 200 ml of ice-cooled, commercially available concentrated nitric acid of guaranteed quality. The mixture was left to stand for one whole day and night and filtered to obtain a solution of titanium oxynitrate. The concentration of Ti ions measured in terms of $TiO_2$ by gravimetric analysis was found to be 0.1204 g Ti/ml. The solution of titanium oxynitrate (130 ml) was mixed with 81.6126 g of lead nitrate of guaranteed quality (purity, 99.5%), 19.5933 g of calcium nitrate tetrahydrate of guaranteed quality (purity, 99.5%), 73.19 ml of nitric acid of guaranteed quality and 1432 ml of ion-exchanged water to form an aqueous solution with Pb/Ca/Ti=0.75/0.25/1.00 (molar ratio) and $HNO_3$/Ti=3/1 (molar ratio). This solution was held at room temperature.

Oxalic acid dihydrate of guaranteed quality (62.129 g; purity, 99.5%) was dissolved in 4095 ml of ethanol of guaranteed quality and the resulting solution was held at room temperature. This solution was such that when mixed with the previously prepared aqueous solution, the molar ratio of $(COOH)_2/(Pb+Ca+Ti)$ would be 0.75 and the volume ratio of ethanol to the acidic aqueous solution being 3/1.

The acidic aqueous solution was added to the vigorously agitated ethanolic solution of oxalic acid at a rate of about 219 ml/min to form a white slurry solution. After the addition was completed, the slurry solution was agitated for an additional 5 minutes. Thereafter, aqueous ammonia of guaranteed quality (206.3 ml) was poured into the agitated slurry solution over a period of about 1 minute, followed by continued stirring for 5 more minutes. The pH of the slurry solution as measured with BTB test paper was 7.2.

A mother liquor in the slurry solution was separated from a white precipitated cake by means of a pressurized filter machine.

The separated white cake was charged into 3417 ml of ethanol and subjected to crushing and washing operations for 30 minutes. Subsequently, the washings were separated from a white cake by means of a pressurized filter machine. The white cake obtained by performing another cycle of these operations was dried for one hour in a pressurized filter machine under a nitrogen stream. The resulting semi-dry cake was spread thinly over a stainless steel plate the surface of which was held at 150° C. so as to evaporate ethanol. The cake was further dried in an oven with internal air circulation at 100° C. for 6 hours so as to obtain a precursor powder.

The precursor powder was slightly crushed in an agate motar and thereafter calcined in a muffle furnace at 1,000° C. for 2 hours to obtain the desired oxide powder at a yield of 96.2%.

Physical property of the oxide powder

The compositional formula of the oxide powder as measured by X-ray fluoroscopy was $(Pb_{0.75}Ca_{0.25})Ti_{0.99}O_3$.

(2) Fabrication of dielectric composite material

Eight gram of a polyacetal resin (Delrin 500 of E.I. du Pont Numerous) was worked on a mixing mill with two rolls heated at 185° C. After the resin formed a uniform melt, 4 g of acrylonitrile-butadiene rubber (ZF-11 of Nippon Zeon Co., Ltd.) was added in small portions. The resin and the rubber were uniformly mixed for 15 minutes with 49.7 g of the $(Pb_{0.75}Ca_{0.25})TiO_3$ previously prepared in (1) as it was added in small portions.

A sheet having a diameter of 8 cm and a thickness of 198 μm was molded from the composite with a press heated at 185° C. Disks having a diameter of 2 cm were punched from this sheet and an electrode having a diameter of 1 cm and a conductor path with a width of 1 mm were formed on both sides of each disk by aluminum deposition.

(3) Electrical characteristics of the piezoelectric composite material

The disks furnished with electrodes were placed in an oven heated at 80° C. and a d.c. electric field of 200 kV/cm was applied to these disks for 1 hours. After the electric field was removed, the disks were cooled to room temperature to make piezoelectric composite materials having thermoelectret states.

The electromechanical coupling factor (Kt) of a sample was 33.4%. The sample had a dielectric constant ($\epsilon$) of 79 at 10 kHz.

The procedures of Kt measurement were as follows: electric impedance ($1Z_1$) and phase angle ($\theta$) were measured with an impedance analyzer (YHP 4191A) over the frequency range that was set with a personal computer (PC 9800 VM2); the resulting impedance curves were processed with a mainframe computer to calculate best fitting values of Kt, sound velocity, dielectric constant, tan $\delta_M$ and tan $\delta_E$.

Dielectric constant measurements were also conducted for composite films that were furnished with gold-deposited electrodes but which did not receive any treatment for creating thermoelectret states. The measuring instruments were LCR meters (YHP-4274A and YHP-4275A).

While the invention has been described in detail and with reference to specific embodiments thereof, it will be apparent to one skilled in the art that various changes and modifications can be made therein without departing from the spirit and scope thereof.

What is claimed is:

1. A process for producing a $ABO_3$ perovskite oxide where A is at least one element selected from the group consisting of Pb, Ca, Sr, and La; and B is at least one element selected from the group consisting of Ti and Zr which comprises allowing an acidic aqueous solution containing A and B ions in amounts corresponding to their proportions in said perovskite oxide to have contact with oxalic acid in the presence of at least one alcohol selected from the group consisting of ethanol, propanol, butanol, pentanol and hexanol, to effect formation of a precipitate of oxalic acid salts that serves as a precursor of said oxide, and subsequently calcining said precursor precipitate to effect formation of said perovskite oxide, wherein the oxalic acid that is contacted by said acidic aqueous solution is in an amount that is equal to the sum of 0.98 to 1.02 moles per mole of at least one B element in said acidic aqueous solution and acid radicals present in the solution containing said precursor precipitate are neutralized with ammonia or an amine.

2. A process as claimed in claim 1, wherein oxalic acid is added in an amount that is equal to the sum of 0.99 to 1.01 moles per mole of element A present in said aqueous solution and 0.495 to 0.505 mole per mole of element B also present in said aqueous solution.

3. A process as claimed in claim 1, wherein an aqueous solution of elements A and B is mixed with an alcoholic solution of oxalic acid.

4. A process as claimed in claim 1, wherein the aqueous solution of elements A and B is an aqueous solution rendered acidic with nitric acid.

5. A process as claimed in claim 4, wherein nitric acid is added in an amount ranging from 0.01 to 4 moles per mole of element B.

6. A process as claimed in claim 1, wherein the solution of elements A and B is a solution of nitrates of element A and oxynitrates of element B that is rendered acidic with nitric acid.

7. A process as claimed in claim 1, wherein said at least one alcohol is present in an amount 1 to 10 volumes in the solution containing the precursor precipitate with respect to one volume of water also present in said solution.

8. A process as claimed in claim 1, wherein the neutralization with ammonia or an amine is performed until the neutralized solution containing the precursor precipitate has a pH in the range of 6.2 to 7.5.

9. A process as claimed in claim 1, wherein the neutralization is performed by addition of gaseous or aqueous ammonia.

10. A process as claimed in claim 1, wherein said precursor precipitate is recovered as a white cake by filtration, the recovered white cake is dried and crushed into particles to obtain a precursor powder and the precursor powder is calcined at 600° to 1,100° C.

* * * * *

UNITED STATES PATENT AND TRADEMARK OFFICE
CERTIFICATE OF CORRECTION

PATENT NO. : 4,874,598
DATED : Oct. 17, 1989
INVENTOR(S) : Kyoko Oda, et al

It is certified that error appears in the above-identified patent and that said Letters Patent is hereby corrected as shown below:

On the title page

The second inventor's name is incorrectly recorded, "Kunimasa Takahasi", should be --Kunimasa Takahashi--

Signed and Sealed this

Ninth Day of October, 1990

Attest:

HARRY F. MANBECK, JR.

Attesting Officer

Commissioner of Patents and Trademarks